United States Patent [19]

MacLachlan

[11] 3,867,153

[45] Feb. 18, 1975

[54] PHOTOHARDENABLE ELEMENT

[75] Inventor: Alexander MacLachlan, Middletown, N.J.

[73] Assignee: E. I. du Pont de Nemours and Company, Wilmington, Del.

[22] Filed: Sept. 11, 1972

[21] Appl. No.: 287,666

[52] U.S. Cl. .......... 96/79, 96/67, 96/35.1, 96/115 R, 96/115 P, 96/36.2, 156/272, 161/1, 161/36, 161/39, 161/145, 161/149, 161/166, 161/410, 161/411, 161/412

[51] Int. Cl. .......... G03c 1/76, G03c 1/68

[58] Field of Search .......... 161/1, 36, 39, 145, 147, 161/149, 166, 410, 411, 412; 156/272; 96/35.1, 115 R, 115 P, 67, 78, 79

[56] References Cited

UNITED STATES PATENTS

| | | | |
|---|---|---|---|
| 1,333,579 | 3/1920 | Schumacher | 161/149 |
| 1,785,696 | 12/1930 | Hackett et al. | 161/149 |
| 1,845,133 | 2/1932 | Davis, Jr. | 161/149 |
| 3,558,387 | 1/1971 | Bassemir et al. | 161/412 |
| 3,645,730 | 2/1972 | Frank et al. | 96/35.1 |
| 3,661,576 | 5/1972 | Crary | 96/35.1 |
| 3,666,133 | 5/1972 | Benning | 161/410 |
| 3,726,688 | 4/1973 | Rust | 96/35.1 |

*Primary Examiner*—George F. Lesmes
*Assistant Examiner*—Charles E. Lipsey

[57] ABSTRACT

An improved photohardenable element is provided which comprises (1) a support, (2) photohardenable layer and (3) a protective cover sheet laminated to the surface of said photohardenable layer. The improvement consists of hardening a small continuous region along the edges of the photohardenable layer, i.e., by selectively exposing the region to actinic radiation. The major portion of said photohardenable layer is between said narrow continuous regions and is substantially unhardened and enexposed to actinic radiation, said narrow continuous regions being at least 0.00005 inches wide and of sufficient width to prevent excessive laminar flow of the photohardenable layer caused by pressure and temperature when the element is in stacked sheet or roll form.

8 Claims, No Drawings

PHOTOHARDENABLE ELEMENT

BACKGROUND OF THE INVENTION

1. Field of the Invention

The invention relates to photohardenable elements useful in the photomechanical arts, e.g., photoresists for printed circuits, printing plates, etc., and comprising a photohardenable layer (i.e., photopolymerizable or photocrosslinkable layer) between two supports, at least one of which is usually a flexible transparent film.

2. Description of the Prior Art

Photohardenable elements comprising a photopolymerizable or a photocrosslinkable layer sandwiched between two flexible supports are known. Illustrative of such elements are those described in Assignee's patents, Celeste, U.S. Pat. Nos. 3,469,982; 3,526,504; 3,607,264; Chu and Cohen, U.S. Pat. Nos. 3,615,435 and 3,649,268. The elements of the above patents are useful in a variety of processes of image reproduction in the photomechanical field, e.g., color-proofing, printed circuits, engineering reproduction films, etc. The photohardenable layers of these elements usually comprise a photopolymerizable liquid monomer in combination with a polymeric binder, although photohardenable polymers are known and can be used. The term "photohardenable" as used herein refers to systems in which the molecular weight of at least one component of the layer is increased by exposure to actinic radiation for a sufficient amount of time to cause a change in the rheological and thermal behavior of the exposed areas. Depending on the layer thickness and composition, e.g., ratio of binder polymer to monomer, added plasticizer, etc. the rheological behavior, i.e., the plasticity, may be such that when laminated elements, similar to some of those described in the above patents, are rolled up, stacked in sheets or otherwise subjected to greater than ambient pressure and/or temperature, the photohardenable layer tends to exude from the edges of the sandwich-type structure and fuse laps of the element together. When a roll having fused laps is placed in a stripping and laminating machine such as that described in Assignee's Heiart, U.S. Pat. No. 3,404,057, the fused edges tend to prevent the smooth unwinding of the roll thus causing damage either to the photosensitive element or the machine or both. Damage to the element may be in the form of tears in the element or delamination from the support where such delamination is not intended at that stage of the process.

SUMMARY OF THE INVENTION

The above-described difficulties have been substantially eliminated by the element, and the process of manufacturing said element, described below.

The element comprises a highly plasticized relatively soft photohardenable layer, having a thickness of from 0.00005 to 0.05 inch or more, laminated between two supports, e.g., film supports as described in the above Colgrove, Celeste and Chu and Cohen patents, said element having the rheology of the edge portions of the photohardenable layer changed to the extent that said layer no longer tends to exude or flow from between the supports under conditions of increased pressure caused by rolling up the material and/or by storage at elevated temperatures. The elements may contain more than one photohardenable layer.

For example, if an element as described in Chu and Cohen, U.S. Pat. No. 3,649,268 were to be prepared wherein the photopolymerizable layer was highly plasticized and relatively soft and had a thickness of about 0.001 inch and rolled up, in time the photopolymerizable layer would exude out of, and fuse the edges of the laps together making unwinding difficult if not impossible. If the ends of the same rool, immediately after winding were subjected to, for example, a short exposure to actinic radiation it will be found that no exudation or fusion of the laps takes place. A roll of the described photopolymerized element exposed in the above manner can easily be unrolled and laminated in the manner described in the above Heiart patent with no evidence of damage to the element or to the stripping and laminating machine. In other words, by hardening edge portions of the element, the photopolymerizable layer is sealed in a confined space and cannot exude out the edges.

DESCRIPTION OF THE PREFERRED EMBODIMENTS

In general, the invention is directed to an improved photohardenable element comprising in order, (a) a support, (b) at least one photohardenable layer, (c) an integral cover sheet laminated to the photohardenable layer, at least two parallel edges of the photohardenable layer being hardened, e.g., by exposure to radiation.

The photohardenable layer is highly plasticized either by the polymerizable monomer and/or by the addition of a non-polymerizable plasticizing compound, e.g., dioctyl phthalate to provide more desirable physical properties i.e., low glass transition temperature. The cover sheet, which preferably is oxygen impermeable has less adherence for the photohardenable layer than the base support when the element is at room temperature. The cover sheet is easily removed by stripping, leaving the photosensitive layer on the base support. In one modification, the photosensitive layer can then be quickly and firmly laminated to a surface to be modified by etching or plating as taught by Celeste, U.S. Pat. No. 3,469,982. The base support can then be stripped off before or after exposure as desired. The hardened edge portions may extend from 0.00005 to 0.010 inch or more from the edge of the element, the width of the hardened portion being dictated by the plasticity and thickness of the photohardenable layer, the diameter of the roll (footage per roll) and the temperatures which may be encountered in storage. A 0.010 inch wide strip of hardened photopolymer will be found to be adequate for most any roll or diameter, although additional width can be used if desired. More specifically, a 0.005 inch wide strip will be found to be adequate, e.g., for rolls up to 1000 feet long with a photohardenable layer of up to 0.003 inch in dry thickness, a 0.001 inch wide strip will be adequate for rolls up to 400 feet in length with a photohardenable layer 0.002 inch in dry thickness; and a 0.0005 inch wide strip will be found to be adequate for rolls up to 200 feet long and a photohardenable layer 0.001 inch in dry thickness. All of the above width parameters will also be found adequate up to temperatures of from 50°C. to about 55°C., with the photopolymerizable compositions of the succeeding examples.

The hardened strips may be formed by exposing the ends of rolls of the photohardenable element to sources of actinic radiation. Alternatively, the edges may be exposed while the element is passed over a suitably masked exposure source, or by exposing the edges of a stack of sheets. Since most photohardenable materials generally exhibit their maximum sensitivity in the ultraviolet range, i.e., 300–400 nm., the radiation source should furnish an effective amount of this radiation. Such sources include carbon arcs, mercury-vapor arcs, fluorescent lamps with special ultraviolet-emitting phosphors, argon glow lamps, electronic flash units, and photographic flood lamps. Other light sources are satisfactory when material sensitive to visible light is used. The amount of exposure required for satisfactory hardening of a given element edge is a function of exposure time, type of light source used, and distance between light source and element edge. Other methods may be used to harden the continuous region along the edges of the photohardenable layer such as coating an edge margin of the desired width with a thermal initiator and passing the striped area past an adequate heat source. It may be desirable, in some cases, to carry out the edge portion hardening operation in an inert atmosphere although this usually is not necessary. In the specific instance when the edges of the photohardenable layer are sensitive to laser radiation, any of the above methods may be used with the appropriate laser radiation source to harden the edges.

The photohardenable layer generally comprises a photohardenable constituent, a binder and a photoactivated initiator for said photohardenable constituent. Suitable binders for use in the photohardenable layer of the present invention include:

a. Copolyester, e.g., those prepared from the reaction produce of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and iosphthalic acids, and (5) mixtures of copolyesters prepared from said glycols and (i) terephthalic, isophthalic and sebacic acids and (ii) terephthalic, isophthalic, sebacic and adipic acids.
b. Nylons or polyamides, e.g., N-methoxymethyl polyhexamethylene adipamide;
c. vinylidene chloride copolymers, e.g., vinylidene chloride/acrylonitrile; vinylidene chloride/methacrylate and vinylidene chloride/vinylacetate copolymers;
d. ethylene/vinyl acetate copolymers;
e. cellulosic ethers, e.g., methyl cellulose, ethyl cellulose and benzyl cellulose;
f. polyethylene;
g. synthetic rubbers, e.g., butadiene/acrylonitrile copolymers, and chloro-2-butadiene-1,3-polymers;
h. cellulose esters, e.g., cellulose acetate, cellulose acetate succinate and cellulose acetate butyrate;
i. polyvinyl esters, e.g., polyvinyl acetate/acrylate, polyvinyl acetate/methacrylate and polyvinyl acetate;
j. polyacrylate and alpha-alkyl polyacrylate esters, e.g., polymethyl methacrylate and polyethyl methacrylate;
k. high molecular weight polyethylene oxides of polyglycols having average molecular weight from about 4,000 to 1,000,000;
l. polyvinyl chloride and copolymers, e.g., polyvinyl chloride/acetate;
m. polyvinyl acetal, e.g., polyvinyl butyral, polyvinyl formal;
n. polyformaldehydes;
o. polyurethanes;
p. polycarbonates;
q. polystyrenes.

If the photohardenable layer is a photopolymerizable layer, then, in addition to the ethylenically unsaturated monomers mentioned in the Examples, the following free-radical initiated, chain-propagating, addition polymerizable ethylenically unsaturated compounds, having a molecular weight of at least 300, can be used with the above-described binders: alkylene, polyalkylene glycol diacrylate, prepared from an alkylene glycol of 2 to 15 carbons; and polyalkylene ether glycol, of 1 to 10 ether linkages. Furthermore, those compounds fitting the above description, which are disclosed in Martin and Barney, U.S. Pat. No. 2,927,022, issued Mar. 1, 1960, can also be used, particularly those having a plurality of addition polymerizable ethylenic linkages, preferably present as terminal linkages, and especially those in which at least one and preferably most of such linkages are conjugated with a doubly bonded carbon, including carbon doubly bonded to carbon and to such hetero-atoms as nitrogen, oxygen and sulfur. Such materials are particularly outstanding when the ethylenically unsaturated groups, especially the vinylidene groups, are conjugated with ester or amide structures.

A preferred class of free-radical generating addition polymerization initiators activatable by actinic light and thermally inactive at and below 185°C. includes the substituted or unsubstituted polynuclear quinones, which are compounds having two intracyclic carbonyl groups attached to intracyclic carbon atoms in a conjugated carboxylic ring system. Such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,-10-tetrahydronaphthacenequinone, and 1,2,3,4-tetrahydrobenz(a)anthracene-7,12-dione. Other photoinitiators which are also useful, even though some may be thermally active at temperature as low as 85°C., are described in Plambeck, U.S. Pat. No. 2,760,863, and include vicinal ketaldonyl compounds, such as benzoin, pivaloin, etc., acyloin ethers, e.g., benzoin methyl and ethyl ethers, etc.; α-hydrocarbon substituted aromatic acyloins, including α-allylbenzoin and α-phenylbenzoin.

Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, nathtylamines, beta-naththol, cuprous chloride, 2,6-tert-butyl p-cresol, phenothiazine, pyridene, nitrobenzene and dinitrobenzene. Other useful inhibitors include p-toluquinone and chloranil, and thiazine dyes, e.g., Thionine Blue G.

(C.I. 52025), Methylene Blue B (C.I. 52015) and Toluidine Blue O (C.I. 5204).

Various dyes may be added to increase the visibility of the edge strips and the final resist image. Pigments may also be used in this capacity. Any colorant used, however, should preferably be transparent to the actinic radiation used.

The element and process of manufacture of this invention has many advantages over the prior art particularly in the area of making resist images for printed circuits according to the process disclosed in Celeste, U.S. Pat. No. 3,607,264. For example, the invention allows a greater latitude in compounding the photopolymerizable composition to obtain the desired rheological characteristics. It eliminates fusion of laps in rolls and the damage caused thereby. The process of forming hardened area in strips contiguous with or near the edge of the photohardenable element is easily carried out in a simple manner on a production line basis without the use of complicated equipment.

The invention will now be further illustrated by, but is not intended to be limited to the following detailed examples of various embodiments.

EXAMPLE I

A photopolymerizable composition was formulated using the following ingredients:

| | | |
|---|---|---|
| Methylene chloride | 270.0 | grams |
| Trimethylol propane triacrylate | 35.3 | do. |
| Triethylene glycol diacetate | 10.0 | do. |
| Polymethyl methacrylate | 57.5 | do. |
| 4,4'-bis-(dimethylamino) benzophenone | .98 | do. |
| Tris(4-diethylamino-o-tolyl) methane | .30 | do. |
| 2-o-chlorophenyl-4,5-bis(phenyl) imidazole dimer | 3.92 | do. |
| Victoria Pure Blue BO Dye C.I. 42595 | .03 | do. |
| 4,4',4''-methylidyne tris(N,N-dimethyl aniline | .10 | grams |

The ingredients were thoroughly mixed to form a solution and coated on a 0.001 inch thick polyethlene terephthalate film support and dried at approximately 70°C. to form a layer having a dry thickness of 0.0018 inch. The layer had a blue color and an optical density of 0.4 at 600 nm. A 0.001 inch thick polyethylene film cover sheet was pressure laminated to the surface of the photopolymerizable layer at a temperature of about 60°C. The sandwich-type material was then rolled up on 3 inches diameter cores to 400 foot and 1000 foot rolls. One roll of each stored at room temperature for 3 weeks and another two rolls were stored at a temperature of 50°C. for 2 days. Exudation of photopolymerizable composition, and lap fusion was evident to the extent that the rolls were unacceptable when used in the manner described in Celeste, U.S. Pat. No. 3,469,982 and Heiart, U.S. Pat. No. 3,404,057.

Rolls of the material were then wrapped in black paper with the ends exposed. The ends were then exposed to actinic radiation with a 100 watt Hanovia mercury are at a distance of approximately 12 inches, using various exposure times. The rolls were then stored at room temperature and at 50°C. for various times as indicated in the following table.

AGING AT ROOM TEMPERATURE

| EXPOSURE | REMARKS |
|---|---|
| 10 seconds | 3 months — slight edge fusion |
| 1 minute | no fusion noted after six months |
| 5 minutes | no fusion noted after six months |

AGING AT 50°C.

| EXPOSURE | REMARKS |
|---|---|
| 10 seconds | 2 weeks, slight edge fusion |
| 1 minute | 5–6 weeks, slight edge fusion |
| 5 minutes | no edge fusion noted after six months |

The cover sheet of exposed rolls could be easily stripped and the photopolymerizable surfaces laminated to etchable copper surfaces to form printed circuit resists as taught by the above Celeste and Heiart patents.

Instead of exposing rolls of the photopolymerizable element edgewise, smaller planar pieces (4inches × 4inches) were masked so that only about 0.005 inch of the edges were exposed for 1 minute at a distance of 6 inches with the above Hanovia lamp. The exposed sample and a similar unexposed sheet were put under pressure of about 5000 lbs./in.$^2$ and the edges were examined. The unexposed sheet revealed a flow of photopolymerizable composition amounting to about 0.003 inch from the plastic base edges, whereas the exposed sample showed no noticeable flow from the edge.

EXAMPLE II

A photopolymerizable composition was formulated from the following ingredients:

| | | |
|---|---|---|
| Methylene chloride | 270.0 | grams |
| Pentaerythritol triacrylate | 38.0 | do. |
| Triethylene glycol diacetate | 4.77 | do. |
| Polymethyl methacrylate | 56.1 | do. |
| 4,4'-bis-(dimethylamino)benzophenone | .31 | do. |
| Benzophenone | .62 | do. |
| Victoria Pure Blue BO dye C.I. 42595 | .08 | do. |

The composition was thoroughly mixed, coated to a thickness of 0.0014 inch, dried and otherwise handled as in Example I. The ends of the rolls were given an exposure of two minutes as in that exampe which was necessary to completely eliminate any evidence of edge fusion.

EXAMPLE III

A composition was prepared according to Example I except that the blue dye was replaced by Solvent red C.I. 109. The fried coating was 0.003 inch thick. The ends of the roll were exposed for about 2 minutes as in Example I which was required to stop exudation of the photopolymer layer from the edges and prevent fusion of the laps of the rolls to each other.

What is claimed is:

1. In a photohardenable element, comprising a support, a highly plasticized photohardenable layer and a protective cover sheet, the improvement wherein said photohardenable layer has been hardened to provide narrow continuous regions of hardened material along its edges and wherein the major portion of said photohardenable layer is between said narrow continuous regions and is substantially unhardened and unexposed to actinic radiation, said narrow continuous regions being at least 0.00005 inches wide and of sufficient width to prevent excessive laminar flow of the photohardenable layer caused by pressure and temperature when the element is stacked sheet or roll form.

2. The photohardenable element of claim 1 wherein said photohardenable layer is a photopolymerizable layer.

3. The photohardenable element of claim 1 wherein said photohardenable layer is a photocrosslinkable layer.

4. The photohardenable element of claim 1 wherein said narrow continuous region of hardened material is about 0.00005 to about 0.05 inch wide.

5. The photohardenable element of claim 1 wherein said narrow continuous region of hardened material is photohardened.

6. The photohardenable element of claim 1 wherein said narrow continuous region of hardened material is between said support and said protective cover sheet.

7. The photohardenable element of claim 1 wherein said narrow continuous region of hardened material is disposed along at least two parallel edges of said photohardenable element.

8. The photohardenable element of claim 1 wherein said hardened material contains a colorant.

* * * * *